United States Patent
Iruvanti et al.

(10) Patent No.: US 9,947,603 B2
(45) Date of Patent: Apr. 17, 2018

(54) LID ATTACH OPTIMIZATION TO LIMIT ELECTRONIC PACKAGE WARPAGE

(71) Applicant: International Business Machines Corporation, Armonk, NY (US)

(72) Inventors: Sushumna Iruvanti, Wappingers Falls, NY (US); Shidong Li, Poughkeepsie, NY (US); Kamal K. Sikka, Poughkeepsie, NY (US); Hilton T. Toy, Hopewell Junction, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/964,281

(22) Filed: Dec. 9, 2015

(65) Prior Publication Data

US 2017/0170086 A1  Jun. 15, 2017

(51) Int. Cl.
*H01L 23/10* (2006.01)
*H01L 23/04* (2006.01)
(Continued)

(52) U.S. Cl.
CPC .............. *H01L 23/10* (2013.01); *H01L 21/50* (2013.01); *H01L 24/13* (2013.01); *H01L 24/16* (2013.01); *H01L 24/32* (2013.01); *H01L 24/73* (2013.01); *H01L 24/83* (2013.01); *H01L 24/92* (2013.01); *H01L 2224/131* (2013.01); *H01L 2224/16227* (2013.01); *H01L 2224/32225* (2013.01); *H01L 2224/32245* (2013.01); *H01L 2224/73204* (2013.01); *H01L 2224/73253* (2013.01); *H01L 2224/81815* (2013.01);
(Continued)

(58) Field of Classification Search
CPC ......... H01L 23/10; H01L 23/04; H01L 23/06; H01L 21/563; H01L 23/293; H01L 23/296; H01L 23/3128; H01L 23/3135; H01L 23/3675; H01L 23/42; H01L 21/565; H01L 23/367
USPC ....... 257/706, 704, 710, 712, 718, 726, 727, 257/738, 532, 499, 724; 438/124
See application file for complete search history.

(56) References Cited

U.S. PATENT DOCUMENTS 7,786,569 B2   8/2010   Nakagawa
2002/0074649 A1   6/2002   Chrysler
(Continued)

*Primary Examiner* — Mouloucoulaye Inoussa
(74) *Attorney, Agent, or Firm* — Matthew C. Zehrer

(57) ABSTRACT

An electronic package includes a carrier and a semiconductor chip. In a first aspect a lid is attached to the chip and subsequently the gap between the lid and the carrier is filled by a seal band that includes seal band material and a plurality of shim members. In another aspect, an interleaved seal band includes a pattern of a first type of seal band material and a second type of seal band material. In another aspect, the lid includes a plurality of surfaces at different topographies to reduce the thickness of the seal band between the topographic lid and the carrier. In yet another aspect the electronic package further includes a frame concentric with the chip. The lid is attached to the frame with a solder, epoxy or elastomer and placed on the chip with a thermal interface material. The seal band material is dispensed on the chip carrier and the frame is then moved towards the chip carrier allowing a minimum seal band thickness.

6 Claims, 10 Drawing Sheets

(51) Int. Cl.
*H01L 21/50* (2006.01)
*H01L 23/00* (2006.01)

(52) U.S. Cl.
CPC ............ *H01L 2224/83191* (2013.01); *H01L 2224/83192* (2013.01); *H01L 2224/92125* (2013.01); *H01L 2224/92225* (2013.01); *H01L 2924/1579* (2013.01); *H01L 2924/15311* (2013.01); *H01L 2924/15312* (2013.01); *H01L 2924/15313* (2013.01); *H01L 2924/15787* (2013.01); *H01L 2924/163* (2013.01); *H01L 2924/16195* (2013.01); *H01L 2924/19041* (2013.01); *H01L 2924/19043* (2013.01); *H01L 2924/19105* (2013.01); *H01L 2924/3511* (2013.01)

(56) References Cited

U.S. PATENT DOCUMENTS

| | | | |
|---|---|---|---|
| 2008/0157345 A1 | 7/2008 | Lu et al. | |
| 2010/0039777 A1 | 2/2010 | Houle et al. | |
| 2011/0042784 A1* | 2/2011 | Edwards | H01L 21/563 257/532 |
| 2011/0292621 A1* | 12/2011 | Beaumier | H01L 23/055 361/748 |
| 2015/0214074 A1 | 7/2015 | Liu et al. | |

* cited by examiner

LID ATTACH OPTIMIZATION TO LIMIT ELECTRONIC PACKAGE WARPAGE

FIELD OF THE EMBODIMENTS

Embodiments of the present invention generally relate to electronic devices and more specifically to lid attach techniques to limit warpage within an electronic device package.

DESCRIPTION OF THE RELATED ART

An electronic package may include an integrated circuit (IC) chip, semiconductor die, processing module, and the like, packaged onto a carrier or substrate. This electronic package may be encapsulated by a cover having high thermal conductivity attached to the carrier by a seal band. Flatness of the package is important to ensure reliable higher level device packaging. For example, it is important that the carrier be flat to ensure a reliable electrical connection with a system board and it is important that the cover be flat to ensure a reliable thermal connection with a heat spreader, such as a heat sink.

The electronic device that contains the electronic package generally operates at an elevated temperature since the energy utilized to power the electronic device is converted to heat. Electronic package warpage may be caused by coefficient of thermal expansion (CTE) mismatches of the various components the package. The mismatched CTE results in the various components expanding and contracting at differing rates.

Known solutions to reduce the package warpage include choosing like CTE materials that make up the electronic package, increasing the thickness or stiffness of carrier or lid, and decreasing the thickness of the seal band. Choosing like CTE materials to reduce expansion mismatch is limited since the electrical, mechanical or thermal performance of the package should not detrimentally affected by selecting like CTE materials. Increasing the thickness of the laminate or lid usually leads to higher cost and higher stress in other parts of the package such as the chip contacts electrically connecting the chip and the carrier, underfill between the chip and the carrier surrounding the contacts, and thermal interface material (TIM) between the chip and the lid. Decreasing the thickness of the seal band may be limited because of large openings that exist between the lid and the carrier or because the seal band thickness is already minimized.

SUMMARY

In an embodiment of the present invention, a method to fabricate an electronic package includes electronically connecting a semiconductor chip to a carrier, thermally connecting a lid to the semiconductor chip, and subsequent to thermally connecting the lid to the semiconductor chip, forming a seal band that connects the carrier and the lid perimeter.

In another embodiment of the present invention, a method to fabricate an electronic package includes electronically connecting a semiconductor chip to a carrier, forming an interleaved seal band upon the carrier about the perimeter of the semiconductor chip, and thermally connecting a lid to the semiconductor chip and to the interleaved seal band.

In yet another embodiment of the present invention, a method to fabricate an electronic package includes electronically connecting a semiconductor chip to a carrier, forming a lid-frame assembly by joining a frame comprising an opening with a lid, connecting the lid-frame assembly to the chip and to the carrier by thermally connecting the lid to the semiconductor chip and thermally connecting the frame to the carrier via a seal band such that the chip lays within the opening, and moving the frame relative to the lid toward the carrier to reduce the thickness of the seal band.

In another embodiment of the present invention, a electronic package includes a carrier comprising a top surface and a bottom surface, a semiconductor chip electrically connected to the top surface; a lid thermally connected to a top surface of the semiconductor chip, and a seal band connecting the carrier and the lid perimeter, the seal band comprising a first bead of seal-band material and a plurality of shim members between the carrier and the lid perimeter.

In another embodiment of the present invention, an electronic package includes a carrier comprising a top surface and a bottom surface, a semiconductor chip electrically connected to the top surface, a lid thermally connected to a top surface of the semiconductor chip, and a interleaved seal band connecting the carrier and the lid perimeter.

In yet another embodiment of the present invention, a electronic package includes a carrier comprising a top surface and a bottom surface, a semiconductor chip electrically connected to the top surface, a frame comprising an opening upon the carrier, wherein the semiconductor chip is located within and concentric with the opening, a lid thermally connected to a top surface of the semiconductor chip, and join material that connects the lid and the frame.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
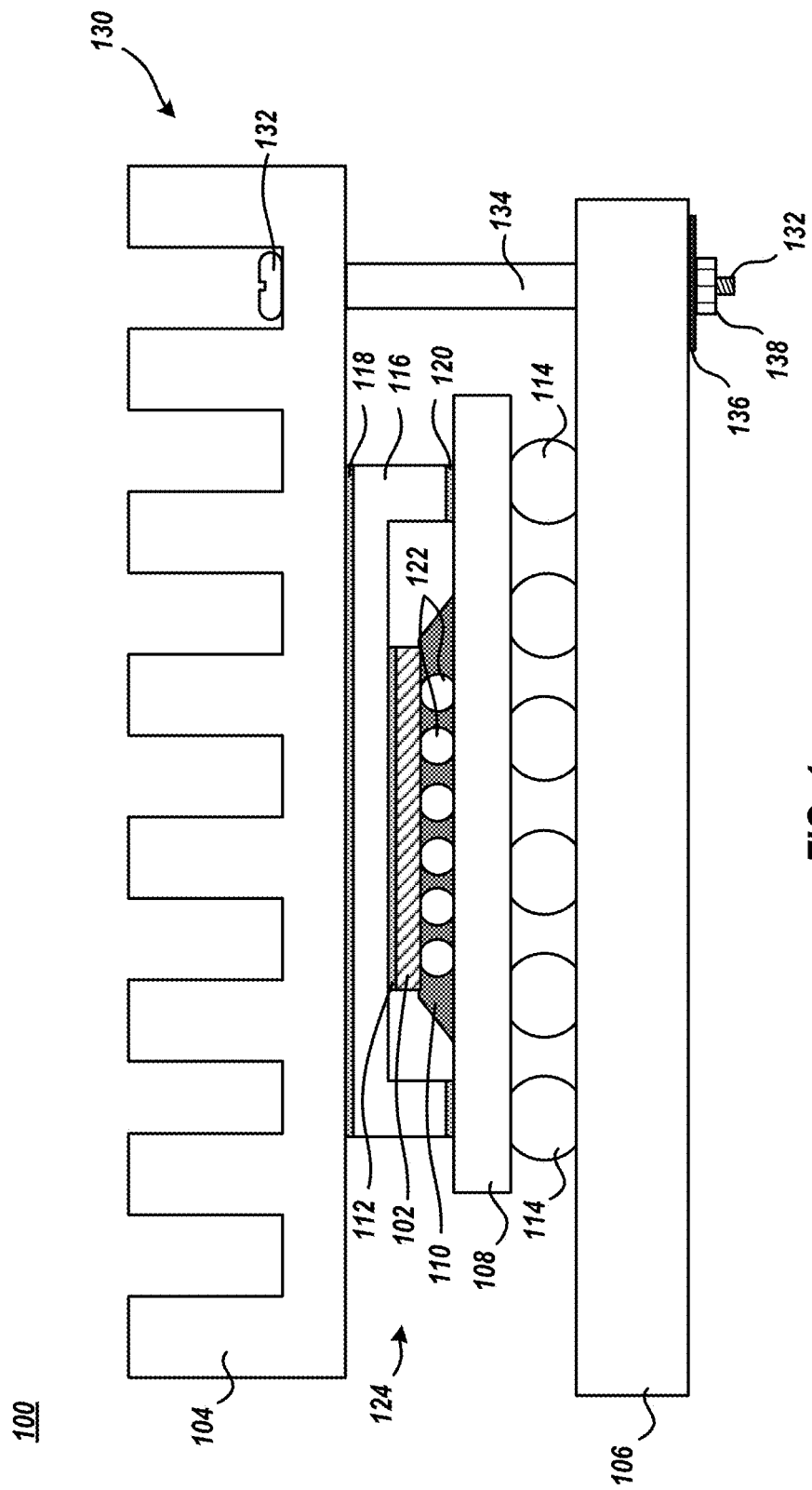
FIG. 1 depicts an electronic device utilizing a prior art electronic package.

FIG. 1 depicts a prior art electronic device 100 utilizing electronic package 124. Electronic device 100 may be, for example, a computer, server, mobile device, tablet, and the like. Electronic package 124 includes IC chip 102, carrier 108, interconnects 122, underfill 110, thermal interface material 112, lid 116, and seal band adhesive 120. Chip 102 may be an integrated circuit, semiconductor die, processor, microchip, and the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may electrically isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with seal band adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Electronic package 124 may be connected to a system board 106 via interconnects 114. System board 106 may be the main printed circuit board of electronic device 100 and includes other electronic device components, such as a graphics processing unit, memory, and the like, and provides connectors for other peripherals. Interconnects 114 electrically connect the lower side of carrier 108 to system board 106 and may be a wire bond, solder bond, stud, conductive ball, conductive button, and the like. Interconnects 114 may be larger and thus more robust than interconnects 122. When electronic package 124 is seated upon system board 106 a second reflow process may be performed to join interconnects 114 to electrical contacts of both carrier 108 and system board 106.

In another implementation, the electronic package 124 may be electrically connected to the system board 106 via a socket (not shown). In this implementation, the socket includes interconnects and may be soldered or otherwise placed upon system board 106. The electronic package 124 may be subsequently inserted into the socket to establish electrical connection between interconnects 114 and the socket interconnects to provide for electrical communication between the electronic package 124 and the system board 106.

To assist in the removal of heat from chip 102 a heat sink 104 may be thermally joined to electronic package 124 via thermal interface material 118. Heat sink 104 may be a passive heat exchanger that cools chip 102 by dissipating heat into the surrounding air. As such, during operation of electronic device 100, a thermal path exists from chip 102 to heat sink 104 through thermal interface material 112, lid 116, and thermal interface material 118, and the like. Heat sink 104 may be connected to system board 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon electronic package 124 by heat sink 104 created by the compressive forces. Backside stiffener 136 may mechanically support the compressive forces by distributing the forces across a larger area of motherboard 106. In other applications, connection device 130 may be a clamp, non-influencing fastener, cam, and the like, system that adequately forces heat sink 104 upon electronic package 124.

Thermally connected, joined, and the like, shall herein mean that elements that which are thermally connected are able to efficiently transfer heat there between (e.g., air gaps between the elements are minimized). In some instances, elements that are thermally connected are not directly in physical contact with each other, but rather, are indirectly in contact with each via a thermal interface material. In other instances, elements that are thermally connected are in physical contact with each other. Electrically connected, and the like, shall herein mean that current is able to be efficiently passed from one element to another element (e.g., current flows from a conductor in one element to a conductor in the other element).

Figure 2A:
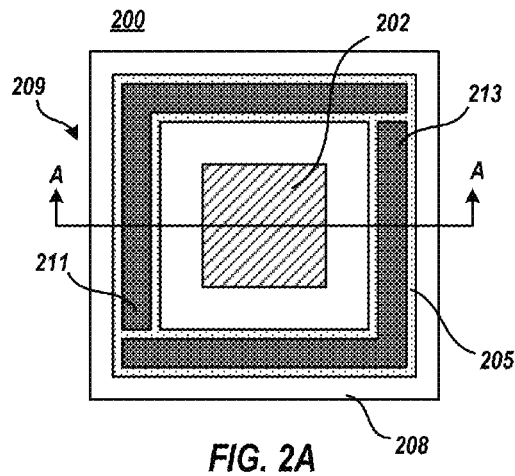
FIG. 2A-FIG. 2C depict views of an exemplary electronic package, according to one or more embodiments of the present invention.
Figure 2B:
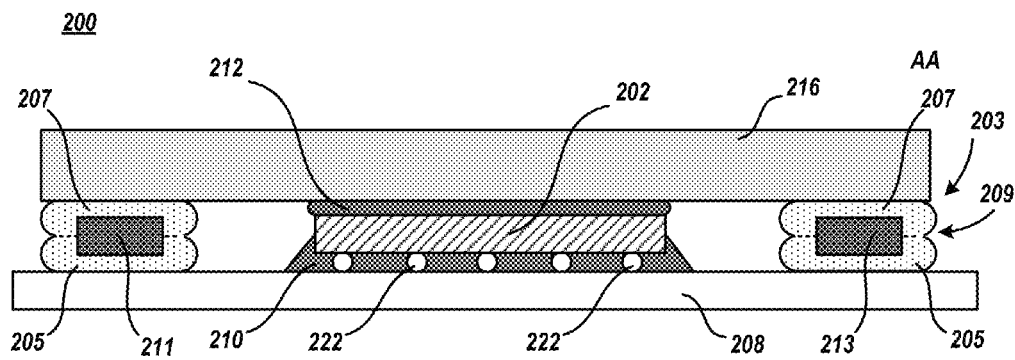
Figure 2C:
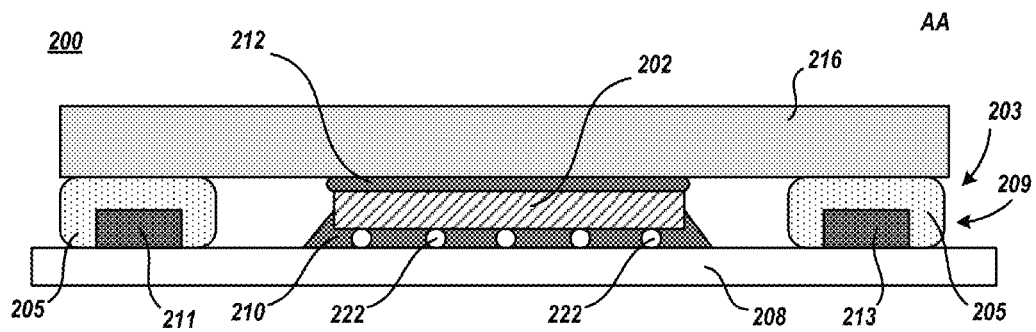

FIG. 2A-FIG. 2C depict views of an exemplary electronic package 200. FIG. 2A depicts a top view of electronic package 200. FIG. 2B and FIG. 2C depict cross section views of alternative implementations of electronic package 200. Electronic package 200 may include IC chip 202, carrier 208, interconnects 222, underfill 210, thermal interface material 212, lid 216, and seal band 203. For clarity, some of the elements of FIG. 2A-FIG. 2C are omitted in another FIG. 2A-FIG. 2C to better depict one or more features described below.

Carrier 208 provides a base on which the chip 202 is mounted and electrically connected thereto via a plurality of interconnects 222. Interconnects 222 may be solder, pillars, wire bonds, studs, buttons, or the like. In a particular embodiment, interconnects are C4 interconnects. Carrier 208 may be composed of ceramics or organic materials. If organic, carrier 208 may include multiple layers of metallization and dielectric materials. Depending upon the configuration of layers, carrier 208 may be a coreless, thin core, or standard core design. The dielectric materials may be, for example, epoxy resin with or without fiberglass fill. In various embodiments, carrier 208 may interconnect with other devices such as a socket (pin grid array, land grid array, ball grid array, and the like) via e.g., contacts 114 (not shown). In various embodiments, carrier 208 may include other devices besides chip 202, for example, surface mount devices (e.g. capacitors, resistors, and the like).

Chip 202 may be for example a microchip, microprocessor, graphic processor, combined processor and graphics processor, application specific integrated circuit (ASIC), system on a chip (SOC), three dimensional integrated circuit, system on insulator (SOI), Field Programmable Gate Array (FPGA), and the like.

Lid 216 is thermally connected to the chip 202. The bottom surface of lid 216 is configured to make thermal contact with chip 202. In certain embodiments, lid 216 has a planar bottom surface. The upper surface of lid 216 is configured to thermally contact heat sink 104. In certain embodiments, lid 216 has a planar upper surface. Lid 216 may be mechanically bonded and thermally connected to carrier 208 by seal band 203. Lid 216 may be made from a thermally conductive material, such as a metal. For example, lid 216 may be formed (e.g., milled, cast, and the like) from copper.

Seal band 203 generally fills the air gap that exists between the perimeter of lid 216 and carrier 208. Seal band 203 includes a shim 209 and seal-band material 205. Shim 209 is a space filler that fills the majority of the dimension that exists between the perimeter of lid 216 and carrier 208. For example, if the carrier 208 is separated from the lid 216 by 1 centimeter, shim 209 has a height of at least 50 mm. The thickness of the shim 209 may be determined by considering one or more seal-band material 205 thicknesses to achieve optimal heat transfer between the shim 209 and either lid 216 and/or carrier 208. The thickness of the shim 209 may therefore be the difference between the dimension between the perimeter of lid 216 and carrier 208 and the one or more seal-band material thicknesses. For example, as exemplary depicted in FIG. 2B, it may be determined that heat transfer is maximized between lid 216 and shim 209 and between shim 209 and carrier 208 when seal-band material is 5 mm. Therefore, if the carrier 208 is separated from the lid 216 by 1 centimeter, the thickness of shim 209 is 90 mm.

Shim 209 is generally positioned within the gap that exists between the perimeter of lid 216 and carrier 208 subsequent to lid 216 being thermally connected to chip 202. Therefore, shim 209 includes at least two members 211 and 213. In another implementation, shim 209 includes four members, etc. When the members of shim 209 are combined, shim 209 has a similar perimeter shape relative to chip 202. For example, if chip 202 has a square perimeter shape shim 209 also has a square perimeter shape, if chip 202 has a hexagon perimeter shape shim 209 also has a hexagon perimeter shape. When the members of shim 209 are combined, shim 209 includes a concentric opening of a similar perimeter shape and larger in dimension relative to chip 202. For example, if chip 202 has a square perimeter shape, shim 209 has a larger square central opening, as is exemplarily depicted in FIG. 2A. Likewise, if chip 202 has a hexagon perimeter shape shim 209 has a larger hexagonal concentric opening. Generally, neighboring members of shim 209 are arranged with one another to collectively surround the perimeter of chip 202 such that the chip 202 is positioned within the opening. The members of shim 209 may be fabricated from a high thermal conductivity material such as a metal, etc.

Seal-band material 205 may be an elastomeric, epoxy, adhesive, etc. material. Seal-band material 205 may be thermally compliant such that seal-band material 205 may adsorb dimensional fluctuations of lid 216 and/or carrier 208 due to thermal expansion. Generally, seal-band material 205 both mechanically joins and thermally connects the shim 209 with lid 216 and carrier 208. Generally, the shape of seal band material 205 is the same as the shape of shim 209 and includes the same concentric opening such that the seal band material 205 surrounds the chip 202 located within the concentric opening.

In one embodiment as is exemplarily shown in FIG. 2B, subsequent to thermally connecting lid 216 and chip 202, seal-band material 205 is formed upon the carrier 208 in the gap between the perimeter of lid 216 and the carrier 208 surrounding the perimeter of chip 202. Subsequently, the shim 209 members are inserted upon the seal-band material 205 in the gap between the perimeter of lid 216 and seal-band material 205. As such, the seal-band material 205 mechanically joins and thermally connects the shim 209 and carrier 208. Subsequently, additional seal-band material 205 (depicted in FIG. 2B as element 207) is formed upon the carrier 208 in the gap between the perimeter of lid 216 and the shim 209 to mechanically join and thermally connect the shim 209 with lid 216. The seal-band material 205 may be formed by injecting the seal-band material upon the respective surfaces as described above.

In one embodiment as is exemplarily shown in FIG. 2C, subsequent to thermally connecting lid 216 and chip 202, the shim 209 members are inserted upon the carrier 208 in the gap between the perimeter of lid 216 and carrier 208 to collectively surround the perimeter of chip 202. Subsequently, seal-band material 205 is formed upon the shim 209 to fill the air gap that exists between shim 209 and the bottom surface of lid 216. For example, the seal-band material 205 may be injected upon the shim 209 so that seal-band material 205 fills the air gap that exists between shim 209 and the bottom surface of lid 216.

The seal-band material 205 may be formed to be located upon at least two surfaces of shim 209. For example, seal-band material 205 may be located upon the top surface, bottom surface, and side surfaces of shim 209. Alternatively, seal-band material 205 may be located upon the top surface and upon the bottom surface of shim 209. Alternatively, seal-band material 205 may be located upon the top surface and upon one or more side surfaces of shim 209.

The seal band 203 allows for warpage of electronic package 200 to be reduced since seal-band thicknesses 205 at the interface between shim 209 and lid 216 and/or shim 209 and carrier 208 may be minimized.

Electronic package 200 may include thermal interface material 212 layers juxtaposed between chip 202 and lid 216. Thermal interface material 212 generally reduces air gaps between chip 202 and lid 216, thereby increasing heat transfer away from chip 202. Thermal interface material 212 may be a thermal gel, thermal compound, thermal paste, heat paste, and the like. In an embodiment, the thickness of thermal interface materials 212 is generally minimized. In certain embodiments, thermal interface material 212 is composed of metallic materials, such as silicone rubber mixed with aluminum and zinc oxide. Other compliant base materials other than silicone rubber and thermally conductive materials may be used.

Figure 3A:
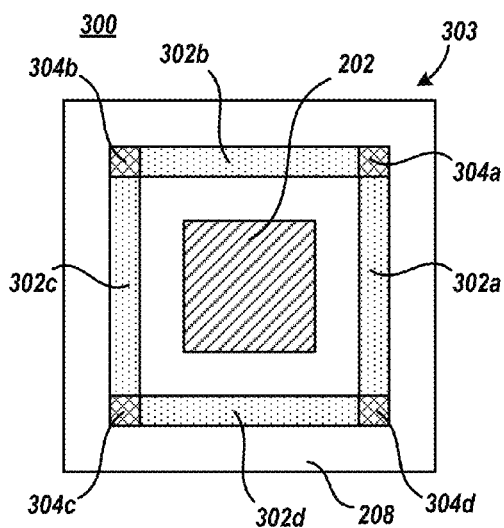
FIG. 3A-FIG. 3C depict views of an exemplary electronic package, according to one or more embodiments of the present invention.
Figure 3B:
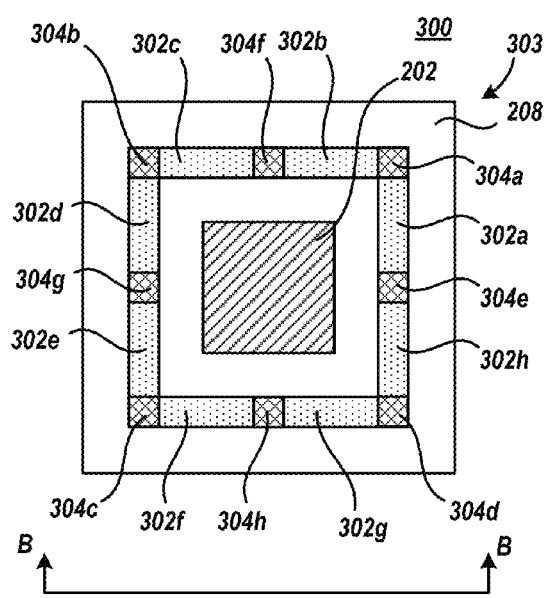
Figure 3C:
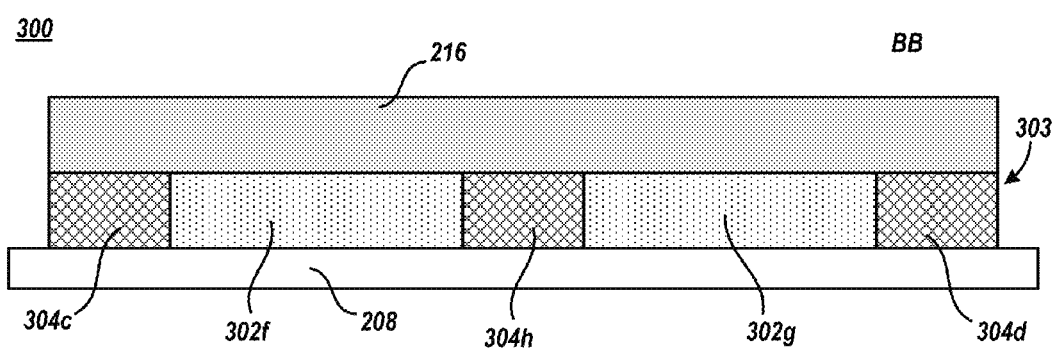

FIG. 3A-FIG. 3C depict views of an exemplary electronic package 300. FIG. 3A and FIG. 3B depict alternative top views of electronic package 300. FIG. 2C depicts a side view of electronic package 300. Electronic package 300 may include IC chip 202, carrier 208, interconnects 222 (not shown), underfill 210 (not shown), thermal interface material 212 (not shown), lid 216, and seal band 303. For clarity, some of the elements of FIG. 3A-FIG. 3C are omitted in another FIG. 3A-FIG. 3C to better depict one or more features described below.

Seal band 303 generally fills the air gap that exists between the perimeter of lid 216 and carrier 208. Seal band 303 includes interleaved high compliant material 302 and low compliant material 304 applied upon carrier 208 about the perimeter of chip 202. High compliant material 302 is more compliant relative to low compliant material 304. That is, high compliant material 302 better adsorbs dimensional fluctuations between lid 216 and carrier 208 due to thermal expansion, relative to low compliant material 304. In a particular embodiment, high compliant material 302 may be an elastomeric material and low compliant material 304 may be an epoxy. Generally, seal band 303 both mechanically joins and thermally connects the lid 216 and carrier 208.

Seal band 303 is generally applied upon the carrier 208 prior to lid 216 being thermally connected to chip 202. Seal band 303 is generally applied upon the carrier 208 around the perimeter of chip 202. Therefore, seal band 303 may have a similar perimeter shape relative to chip 202. For example, if chip 202 has a square perimeter shape seal band 303 also has a square perimeter shape, if chip 202 has a hexagon perimeter shape seal band 303 also has a hexagon perimeter shape. Seal band 303 includes a concentric opening of a similar perimeter shape and larger in dimension relative to chip 202. For example, if chip 202 has a square perimeter shape, seal band 303 has a larger square central opening, as is exemplarily depicted in FIG. 3A. Likewise, if chip 202 has a hexagon perimeter shape seal band 303 has a larger hexagonal concentric opening. Generally, seal band 303 is applied to the carrier 208 such that chip 202 is located within the seal band 303 opening.

Seal band 303 may be applied upon carrier 208 by first applying a pattern of low compliant material 304 upon carrier 208 and subsequently applying a pattern of high compliant material 302 upon carrier 208 such that the pattern of low compliant material 304 is interleaved with the pattern of high compliant material 302, or vice versa.

In one embodiment, the low compliant material 304 is patterned such that the low compliant material 304 is located at the corners of seal band 303 and high compliant material 302 is interleaved there between, as is exemplarily shown in FIG. 3A. More specifically, low compliant material 304a-304d are applied upon the carrier 208 forming the corners of seal band 303. High compliant material 302 pattern is then applied upon the carrier between the low compliant material 304 pattern forming the side boundaries of seal band 303. For example, high compliant material 302a is applied upon carrier 208 between low compliant material 304a and 304d, high compliant material 302b is applied upon carrier 208 between low compliant material 304a and 304b, high compliant material 302c is applied upon carrier 208 between low compliant material 304b and 304c, and high compliant material 302d is applied upon carrier 208 between low compliant material 304c and 304d.

In another embodiment, the low compliant material 304 is patterned such that the low compliant material 304 is located at the corners of seal band 303 and at the bisection line of chip 202 and the high compliant material 302 is interleaved there between, as is exemplarily shown in FIG. 3B. For example, low compliant material 304a-304d are applied upon the carrier 208 forming the corners of seal band 303, low compliant material 304e is applied upon the carrier 208 between low compliant material 304a and 304d, low compliant material 304f is applied upon the carrier 208 between low compliant material 304a and 304b, low compliant material 304g is applied upon the carrier 208 between low compliant material 304b and 304c and low compliant material 304h is applied upon the carrier 208 between low compliant material 304c and 304d. High compliant material 302 pattern is then applied upon the carrier between the low compliant material 304 pattern. For example, high compliant material 302a is applied upon carrier 208 between low compliant material 304a and 304e, high compliant material 302b is applied upon carrier 208 between low compliant material 304f and 304a, high compliant material 302c is applied upon carrier 208 between low compliant material 304b and 304f, high compliant material 302d is applied upon carrier 208 between low compliant material 304b and 304g, high compliant material 302e is applied upon carrier 208 between low compliant material 304g and 304c, high compliant material 302f is applied upon carrier 208 between low compliant material 304c and 304h, high compliant material 302g is applied upon carrier 208 between low compliant material 304h and 304d, and high compliant material 302h is applied upon carrier 208 between low compliant material 304d and 304e.

The seal band 303 allows for warpage of electronic package 300 to be reduced by the high compliant material 302 adsorbing dimensional fluctuations between lid 216 and carrier 208 while low compliant material 304 provides the rigidity to adequately couple lid 216 and carrier 208. In other words, the high compliant material 302 allows for the expansion or contraction of the distance between lid 216 and carrier 208 in sections of the seal band 303 while other sections of the seal band 303 maintains a generally fixed dimension and secure bond between lid 216 and carrier 208. In some embodiments, the quantity of low compliant material 304 portions in the interleaved pattern are minimized. In other words, the minimum number of low compliant material 304 portions may be utilized to provide for adequate bonding between lid 216 and carrier 208 while the high compliant material 302 portions are maximized so as to provide for an increased proportion of seal band 303 that allows for the expansion or contraction of the distance between lid 216 and carrier 208.

In certain embodiments one or both of the low compliant material 304 and high compliant material 302 may be electrically conductive to allow electrical grounding of a metal lid 216 to the carrier 208.

Figure 4A:
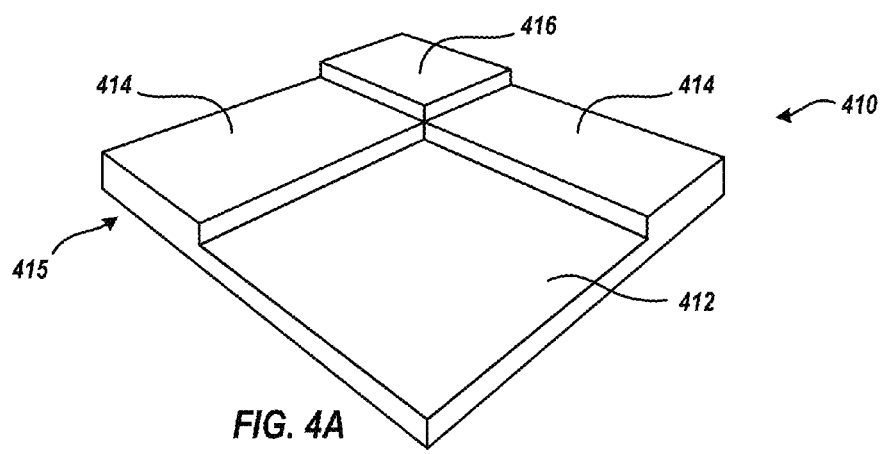
FIG. 4A depicts an isometric portion view of an exemplary electronic package topographic lid, according to one or more embodiments of the present invention.
Figure 4B:
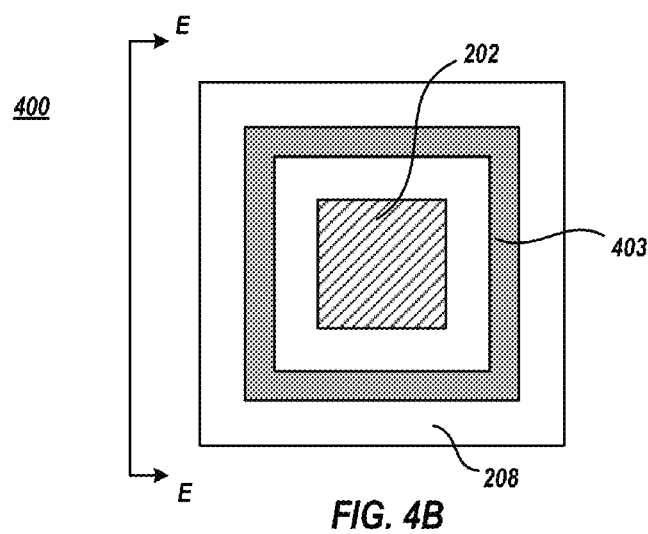
FIG. 4B-FIG. 4C depict views of an exemplary electronic package including the topographic lid, according to one or more embodiments of the present invention.
Figure 4C:
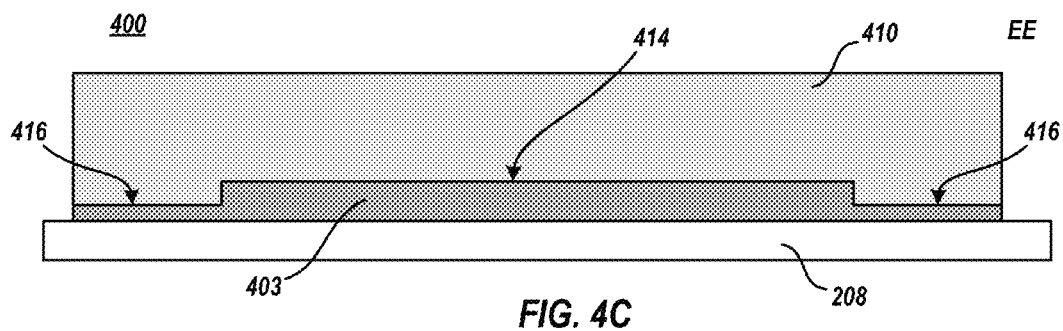

FIG. 4A depicts an isometric portion view of a topographic lid 410 that includes a plurality of perimeter surfaces at different topographies relative thereto. For clarity, only one corner of topographic lid 410 is depicted in FIG. 4A. FIG. 4B and FIG. 4C depict views of an exemplary electronic package 400 including the topographic lid 410. FIG. 4C depicts view EE. Note, the topographic lid 410 that is depicted in FIG. 4C is not shown in FIG. 4B, to better depict other elements of electronic package 400.

The topographic lid 410 includes a chip surface 412 that is configured to thermally connect with chip 202 and a heat sink surface 415 that is configured to thermally connect with heat sink 104. Topographic lid 410 also includes a perimeter surfaces 414 offset from chip surface 412 to reduce the dimension between the perimeter of lid 410 and carrier 208 when lid 410 thermally contacts chip 202. Topographic lid 410 also includes a perimeter corner surface 416 further offset from chip surface 412 to further reduce the dimension between the corners of lid 410 and carrier 208 when lid 410 thermally contacts chip 202. Therefore, topographic lid 410 has a plurality of flat surfaces at different topographies so that the topographic lid 410 thermally connects with chip 202 and provides for a reduction of thickness of the seal band 403 that mechanically bonds and thermally connects topographic lid 410 to carrier 208. In other words, the perimeter surfaces 414 and or corner surfaces 416 are closer to carrier 208 relative to at least the chip surface 412. Topographic lid 410 is configured to be mechanically bonded and thermally connected to carrier 208 by seal band 403 and may be fabricated from a thermally conductive material, such as a metal. For example, topographic lid 410 may be formed (e.g., milled, cast, and the like) from copper.

In embodiments, the topographic lid 410 has a similar perimeter shape of greater dimension relative to the perimeter shape of chip 202. Likewise, seal band 403 includes a concentric opening of a similar perimeter shape and larger in dimension relative to chip 202. For example, if chip 202 has a square perimeter shape, seal band 403 has a larger square central opening, as is exemplarily depicted in FIG. 4B. Likewise, if chip 202 has a hexagon perimeter shape seal band 403 has a larger hexagonal concentric opening. Generally, seal band 403 is applied to the carrier 208 such that chip 202 is located within the seal band 403 opening.

Seal band 403 generally fills the air gap that exists between the perimeter surfaces 414, 416 of lid 410 and carrier 208. Seal band 403 may be the same materials as described with reference to seal band 120. Further, seal band 403 may be similar to seal band 203. In this implementation, seal band material may be applied upon the carrier 208 about the perimeter of chip 202 prior to thermally attaching lid 410 with chip 202. One or more shims may be placed upon the seal band material and additional seal band material may be applied upon the shims. For example, a generally straight shim may be located between the top surface of carrier 208 and the perimeter surfaces 414. Further, seal band 403 may be similar to seal band 303. For example, low compliant material portions may be patterned upon the carrier 208 such that the corners surfaces 416 of lid 410 contact the low compliant material portions. High compliant material portions may be patterned upon the carrier 208 between low compliant material portions such that the perimeter surfaces 414 of lid 410 contact the high compliant material portions.

Figure 5A:
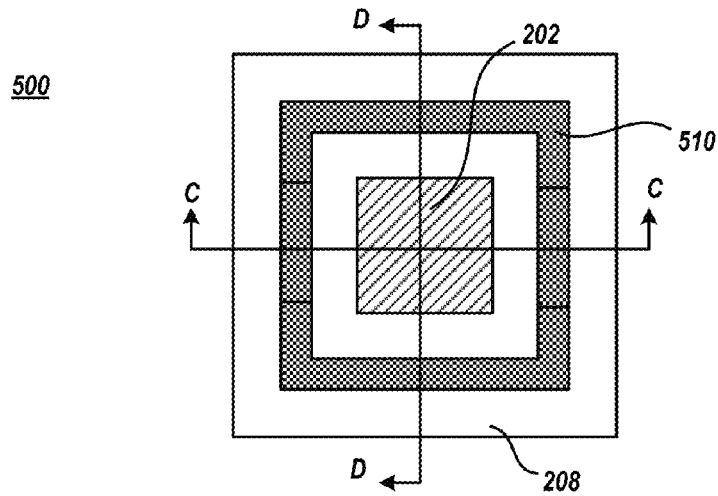
FIG. 5A-FIG. 5E depict views of an exemplary electronic package, according to one or more embodiments of the present invention.
Figure 5B:
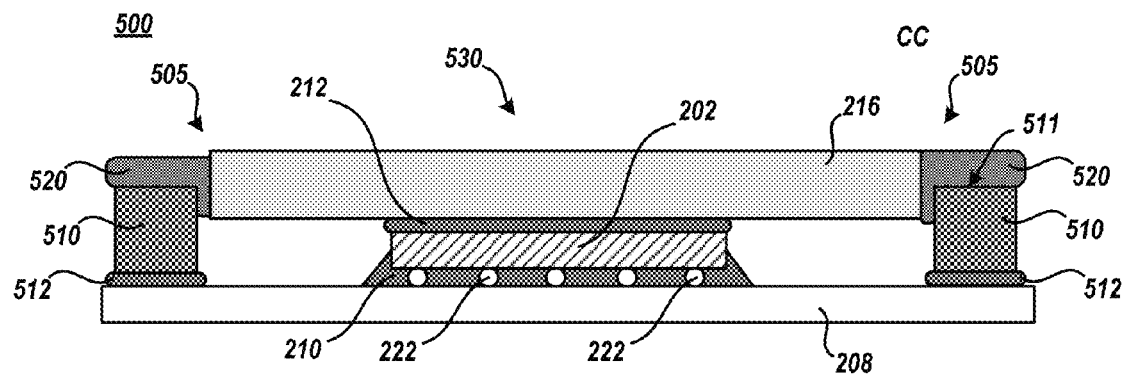
Figure 5C:
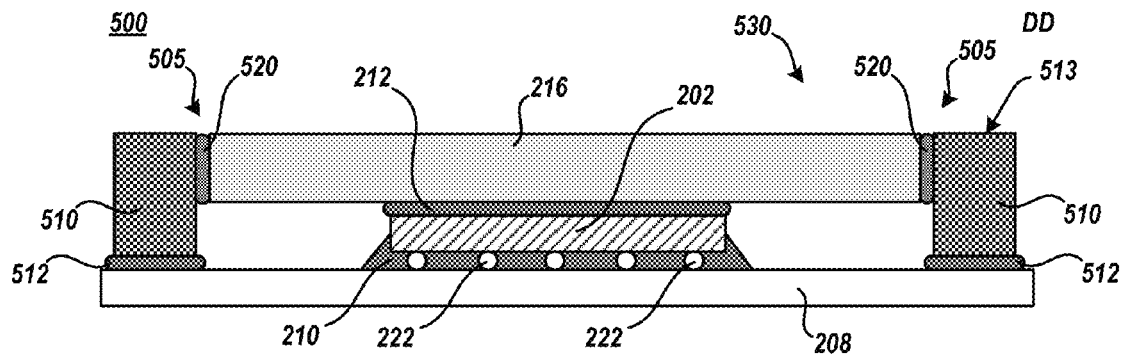
Figure 5D:
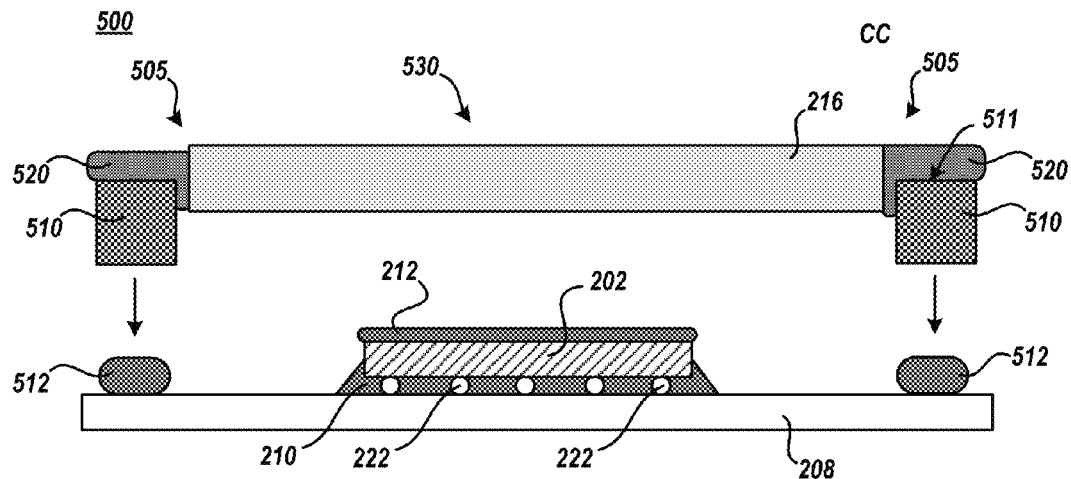
Figure 5E:
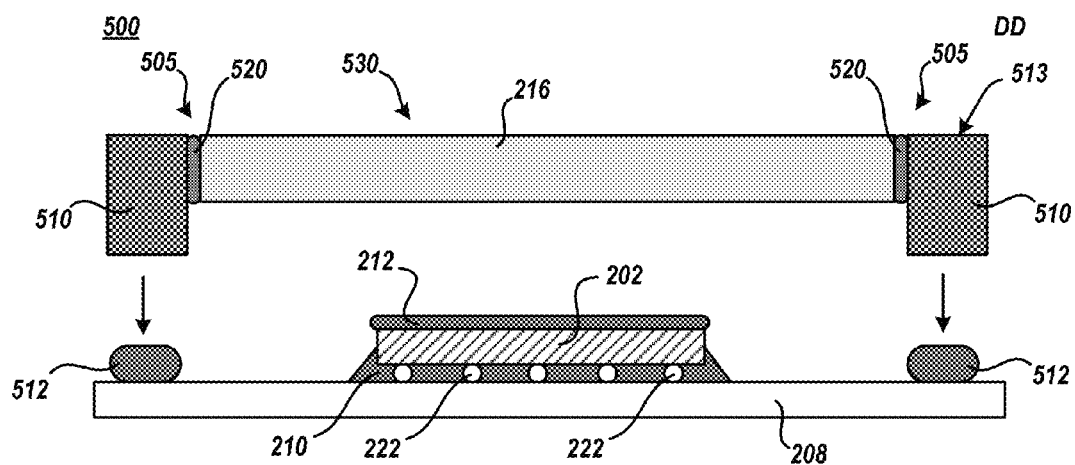

FIG. 5A-FIG. 5E depict views of an exemplary electronic package 500. FIG. 5A depicts a top view of electronic package 500. FIG. 5B and FIG. 5C depict cross section views of electronic package 500 at a particular fabrication stage. FIG. 5D and FIG. 5E depict cross section views of electronic package 500 at a preceding fabrication stage. Electronic package 500 may include IC chip 202, carrier 208, interconnects 222, underfill 210, thermal interface material 212, lid 216, frame 510, seal band 512, and bond material 520. For clarity, some of the elements of FIG. 5A-FIG. 5E are omitted in another FIG. 5A-FIG. 5E so as to better depict one or more features described below.

In the present embodiment, the frame 510 is first attached to the lid 216 with bond material 520 such as solder, epoxy or elastomer to form a lid-frame assembly 530. Subsequently the lid-frame assembly 530 is thermally connected to the chip 202 via thermal interface material 212 and connected to carrier 208 via seal band 512. The lid-frame assembly 530 is initially placed on the chip 202 with the thermal interface material 212 between the chip 202 and the lid 216, allowing a minimum thermal interface gap. The seal band material 512 is subsequently dispensed on the carrier 208 about the perimeter of the chip 202 and the lid-frame assembly 530 is placed upon the seal band material 512 to connect the lid-frame assembly 530 to the carrier 208. Subsequently, the lid-frame assembly 530 may be heated or mechanically loaded to move the frame 510 away from the lid 216 towards the chip carrier 208. Heating of the lid-frame assembly 530 may be necessary in order for the bond material 520 to become compliant to allow the frame 510 to move relative to lid 216. For example, if bond material 520 is solder, a solder reflow allows the bond material 520 to become compliant such that frame 520 may move relative to lid 216. By moving the frame 510 toward carrier 208, a small seal band material 512 gap is achieved, and warpage of electronic package 500 is reduced.

At a particular electronic package 500 fabrication stage seal band 512 is formed upon carrier 208. Seal band 512 generally fills the air gap that exists between the frame 510 and carrier 208. Seal band 512 may be formed of the same materials as described with reference to seal band 120, seal band 303, etc. Seal band 512 material may be applied upon the carrier 208 about the perimeter of chip 202 prior to mechanically bonding and thermally connecting lid-frame assembly 530 to carrier 208. Seal band 512 includes a concentric opening of a similar perimeter shape and larger in dimension relative to chip 202. For example, if chip 202 has a square perimeter shape, seal band 512 has a larger square central opening. Likewise, if chip 202 has a hexagon perimeter shape seal band 512 has a larger hexagonal concentric opening. Generally, seal band 512 is applied to the carrier 208 such that chip 202 is located within the seal band 512 opening.

Frame 510 may be a stiffening frame that once is mechanically bonded to carrier 208 generally stiffens carrier 208. Frame 510 may improve carrier 208 flatness. The flatness of carrier 208 at least partially allows for more efficient assembly or installation of multichip module 500 to the next level of assembly (e.g. motherboard 106, heat sink 104, etc.). Frame 508 may be fabricated from materials with a desirable mechanical strength (e.g. copper, nickel, stainless steel, titanium, aluminum, molded plastics, ceramics, composites or combinations of each, etc.). Frame 510 may be made utilizing materials with a desirable CTE (e.g. similar CTE as carrier 208, etc.). Stiffening frame 202 may be fabricated by forging, plating, stamping, molding, casting, machining, etc. a desired material.

Frame 510 includes a concentric opening. The concentric opening has a shape similar of greater dimension relative to chip 202. For example, the concentric opening is sufficiently large to accept large to accept chip 202 being joined to carrier 208 and to accept lid 216 being joined to chip 202. If chip 202 has a square perimeter shape, the concentric opening is a larger square opening. Likewise, if chip 202 has a hexagon perimeter shape the concentric opening is a larger hexagon opening. Generally, frame 510 is mechanically bonded and thermally connected to the carrier 208 such that chip 202 is located within the concentric opening.

Frame 510 may include a single upper surface. For example, the upper surface of frame 510 may be the only upper surface of frame 510 and may be coplanar with lid 216 upon the lid 216 being thermally connected to chip 202. In this implementation, any cross section of the frame 510 will appear as is exemplarily depicted in FIG. 5C. Alternatively, as is depicted in FIG. 5D and FIG. 5E, frame 510 may have a plurality of upper surfaces 511 and 513. As is shown in FIG. 5D, at cross section CC, frame 510 has an upper surface 511 below the upper surface of frame 216. As is shown in FIG. 5E at cross section DD, frame 510 also has an upper surface 513 that is coplanar with the upper surface of frame 216. In certain embodiments coplanar upper surfaces 511 may exist on two sides of frame 510 as is shown in FIG. 5A and in FIG. 5D. In other embodiments, coplanar upper surfaces 511 may exist on all sides of frame 510 such that upper surfaces 513 may exist on the corners of frame 510. In a particular implementation, frame 510 is a single member frame. In other implementations, frame 510 is made up of multiple frame members.

Subsequently to moving the frame 510 towards carrier 208, or in other words when frame 510 is finally connected to carrier 208, the upper surface of frame 510 may be lower than the upper surface of lid 216 or may alternatively be coplanar with the upper surface of lid 216.

Lid 216 is located within the concentric opening of frame 510 so that a gap 505 initially exists between the perimeter of lid 216 and frame 510. In other words, the lid 216 does not initially make mechanical or direct thermal contact with frame 510. At a subsequent electronic package 500 fabrication stage, the gap 505 is filled by bond material 520 such that bond material 520 mechanically joins and thermally connects the lid 216 with frame 510. As is shown in FIG. 5A, depicting cross section view CC, the bond material 520 may be located between frame 510 and lid 216 and upon the upper surface 511 of frame 510. The upper surface of bond material 520 may be coplanar with the upper surface of lid 216 as is shown in the right side of FIG. 5B. The upper surface of bond material 520 may be below the upper surface of lid 216 as is shown in the left hand side. As is shown in FIG. 5C, depicting cross section view DD, the bond material 520 may be located between frame 510 and lid 216 and absent from the upper surface 513 of frame 510. Bond material 520 is a material that provides mechanical bonding and transfers heat. For example, bond material 520 may be solder, epoxy, or elastomer, etc.

Figure 6:
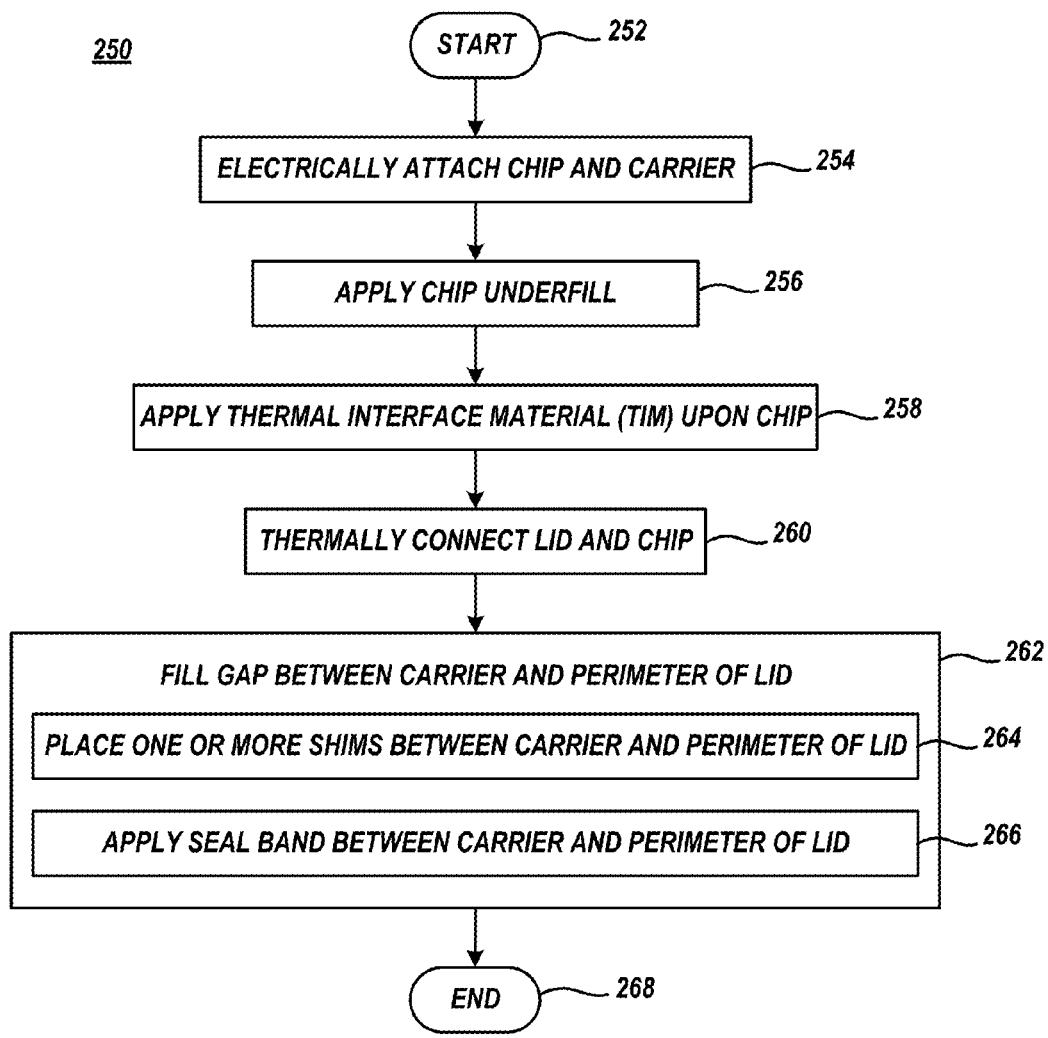
FIG. 6-FIG. 9 depict exemplary methods of fabricating an electronic, according to one or more embodiments of the present invention.

FIG. 6 depicts an exemplary method 250 of fabricating an electronic package 200. Once fabricated the electronic package 200 may be installed into electronic device 100 by electrically connecting the electronic device to motherboard 106 via contacts 114 and by thermally connecting the electronic device to heat sink 114 via thermal interface material 118.

Method 250 begins at block 252 and continues with electrically attaching chip 202 to carrier 208 (block 254). In certain embodiments, chip 202 is attached using a flip-chip solder bump processes including a solder reflow. In other words, contacts 222 may be C4 contacts to electrically connect chip 202 and carrier 208.

Method 250 may continue by dispensing underfill 210 upon carrier 208 around the perimeter of chip 202 at an ambient temperature (block 256). The underfill 210 may be drawn under the chip 202 between the chip 202 and carrier 208 by capillary action. In some embodiments, underfill 210 may be subject to curing at an elevated temperature. The curing of underfill 210 may or may not coincide with the curing of seal band material and/or thermal interface material.

Method 250 may continue with dispensing thermal interface material 212 upon the top surface of chip 202. Method 250 may continue with aligning lid 216 with the chip 202 and thermally attaching the lid 216 with the thermal interface material 212 upon the top surface of chip 202. The lid 216 is generally aligned to be concentric with the chip 202.

Method 250 may continue with filling the gap between carrier 208 and the perimeter of the lid 216 subsequent to the thermal joining of the lid and chip with seal band 203 (block 262). In this manner, lid 216 may be mechanically bonded and thermally connected to carrier 208 by seal band 203. Seal band 203 includes a shim 209 and seal-band material 205. Therefore, method 250 may include placing a shim 209 between the perimeter of lid 216 and carrier 208 (block 264). Further, method 250 may include applying seal-band material 205 between the perimeter of lid 216 and carrier 208 (block 266).

In one implementation, subsequent to thermally connecting lid 216 and chip 202, seal-band material 205 is first formed upon the carrier 208 in the gap between the perimeter of lid 216 and the carrier 208 surrounding the perimeter of chip 202. Subsequently, shim 209 members are inserted upon the seal-band material 205 in the gap between the perimeter of lid 216 and seal-band material 205. As such, the seal-band material 205 mechanically joins and thermally connects the shim 209 and carrier 208. Subsequently, additional seal-band material 205 (depicted in FIG. 2B as element 207) is s formed in the gap between the perimeter of lid 216 and the shim 209 to mechanically join and thermally connect the shim 209 with lid 216.

In another implementation, subsequent to thermally connecting lid 216 and chip 202, shim 209 members are first inserted upon the carrier 208 in the gap between the perimeter of lid 216 and carrier 208 to generally surround the perimeter of chip 202. Subsequently, seal-band material 205 is formed upon the shim 209 to fill the air gap that exists between shim 209 and the bottom surface of lid 216. For example, the seal-band material 205 may be injected upon the shim 209 so that seal-band material 205 fills the air gap that exists between shim 209 and the bottom surface of lid 216. Depending upon the selected materials, a curing process may cure underfill 210, thermal interface material 212, and/or seal-band material 205, etc. Method 250 ends at block 268.

Figure 7:
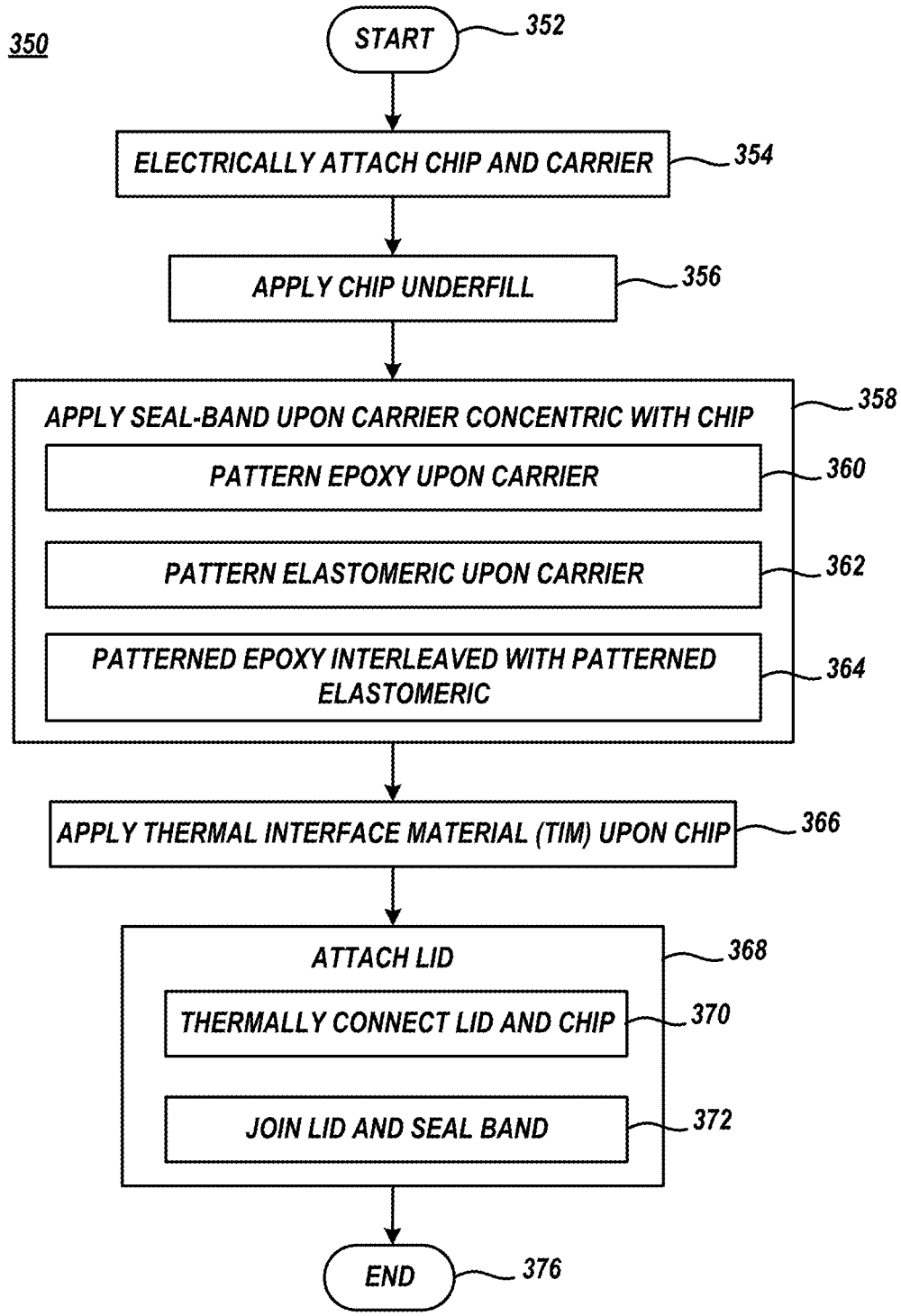

FIG. 7 depicts an exemplary method 350 of fabricating an electronic package 300. Once fabricated the electronic package 300 may be installed into electronic device 100 by electrically connecting the electronic device to motherboard 106 via contacts 114 and by thermally connecting the electronic device to heat sink 114 via thermal interface material 118.

Method 350 begins at block 352 and continues with electrically attaching chip 202 to carrier 208 (block 354). In certain embodiments, chip 202 is attached using a flip-chip solder bump processes including a solder reflow. In other words, contacts 222 may be C4 contacts that electrically connect chip 202 and carrier 208.

Method 350 may continue by dispensing underfill 210 upon carrier 208 around the perimeter of chip 202 at an ambient temperature (block 356). The underfill 210 may be drawn under the chip 202 between the chip 202 and carrier 208 by capillary action. In some embodiments, underfill 210 may be subject to curing at an elevated temperature. The curing of underfill 210 may or may not coincide with the curing of seal band materials and/or thermal interface material.

Method 350 may continue with applying seal band 303 upon carrier 208 about the perimeter and concentric with chip 202 (block 358). Seal band 303 is applied upon the carrier 208 prior to lid 216 being thermally connected to chip 202. Seal band 303 may be applied upon carrier 208 by first applying a pattern of low thermally compliant material 304 upon carrier 208 (block 360) and subsequently applying a pattern of high thermally compliant material 302 upon carrier 208 (block 362) such that the pattern of low thermally compliant material 304 is interleaved with the pattern of high thermally compliant material 302, or vice versa (block 364). In one embodiment, the low thermally compliant material 304 is patterned such that the low thermally compliant material 304 is located at the corners of seal band 303 and high thermally compliant material 302 is interleaved there between. In another embodiment, the low thermally compliant material 304 is patterned such that the low thermally compliant material 304 is located at the corners of seal band 303 and at the bisection line of chip 202 and the high thermally compliant material 302 is interleaved there between.

Method 350 may continue with dispensing thermal interface material 212 upon the top surface of chip 202 (block 366). Method 350 may continue with attaching the lid 216 to the chip 202 and to the seal band 303 (block 368). The lid 216 may be attached by aligning lid 216 to be concentric with the chip 202 and thermally attaching the lid 216 with the thermal interface material 212 upon the top surface of chip 202 (block 370) and mechanically and thermally attaching lid 216 with seal band 303 (block 372). Method 350 ends at block 376. Depending upon the selected materials, a curing process may cure underfill 210, thermal interface material 212, and/or seal-band 303 material, etc.

Figure 8:
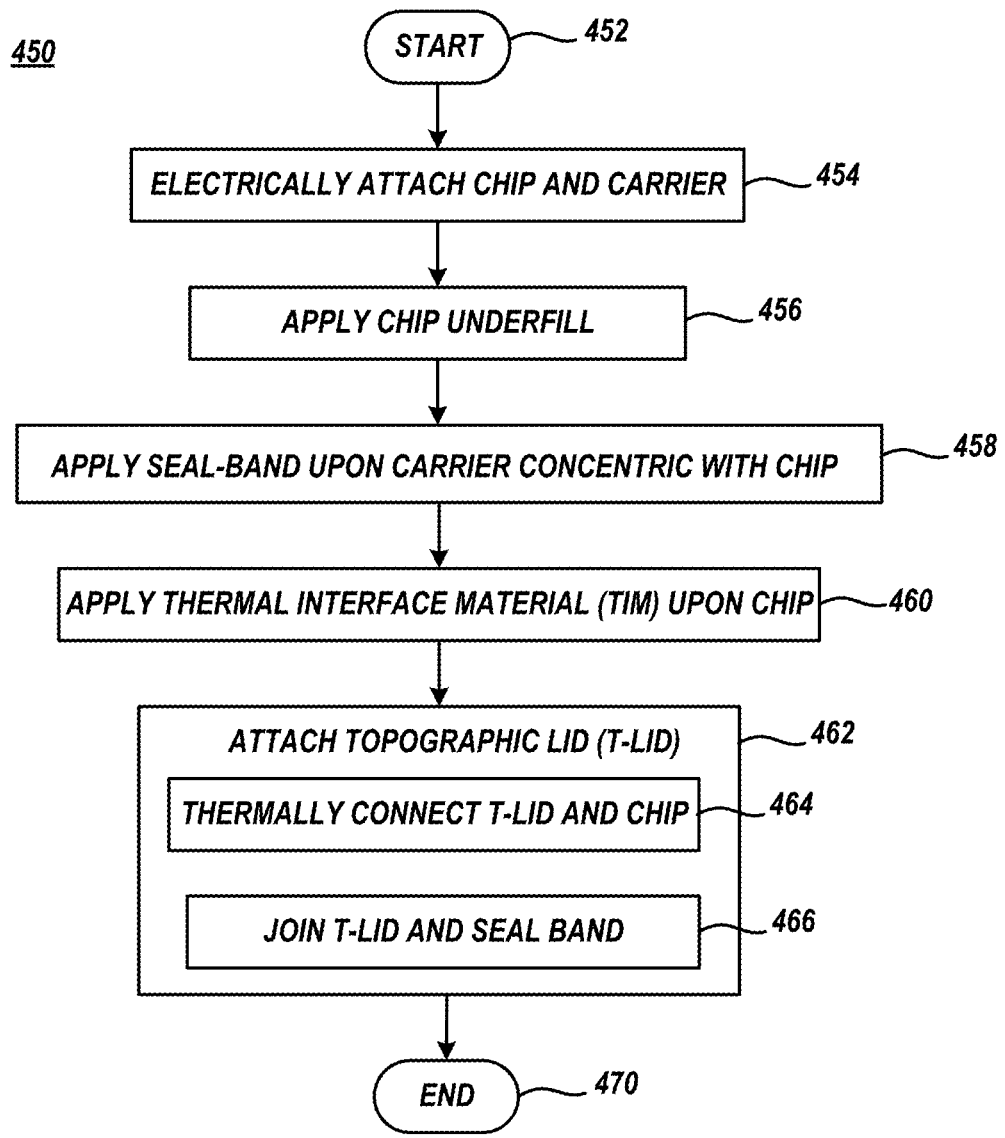

FIG. 8 depicts an exemplary method 450 of fabricating an electronic package 400. Once fabricated the electronic package 400 may be installed into electronic device 100 by electrically connecting the electronic device to motherboard 106 via contacts 114 and by thermally connecting the electronic device to heat sink 114 via thermal interface material 118.

Method 450 begins at block 452 and continues with electrically attaching chip 202 to carrier 208 (block 454). In certain embodiments, chip 202 is attached using a flip-chip solder bump processes including a solder reflow. In other words, contacts 222 may be C4 contacts that electrically connect chip 202 and carrier 208.

Method 450 may continue by dispensing underfill 210 upon carrier 208 around the perimeter of chip 202 at an ambient temperature (block 456). The underfill 210 may be drawn under the chip 202 between the chip 202 and carrier 208 by capillary action. In some embodiments, underfill 210 may be subject to curing at an elevated temperature. The curing of underfill 210 may or may not coincide with the curing of seal band materials and/or thermal interface material.

Method 450 may continue with applying seal band 403 upon carrier 208 about the perimeter and concentric with chip 202 (block 358). Seal band 403 may be applied upon the carrier 208 prior topographic lid 410 being thermally connected to chip 202. Method 450 may continue with dispensing thermal interface material 212 upon the top surface of chip 202 (block 460). Method 450 may continue with attaching topographic lid 410 to the chip 202 and to the seal band 403 (block 466). The topographic lid 410 may be attached by aligning topographic lid 410 to be concentric with the chip 202 and thermally attaching the topographic lid 410 with the thermal interface material 212 upon the top surface of chip 202 (block 464) and mechanically and thermally attaching lid 216 with seal band 403 (block 466). Method 450 ends at block 470. Depending upon the selected materials, a curing process may cure underfill 210, thermal interface material 212, and/or seal-band 403 material, etc.

Figure 9:
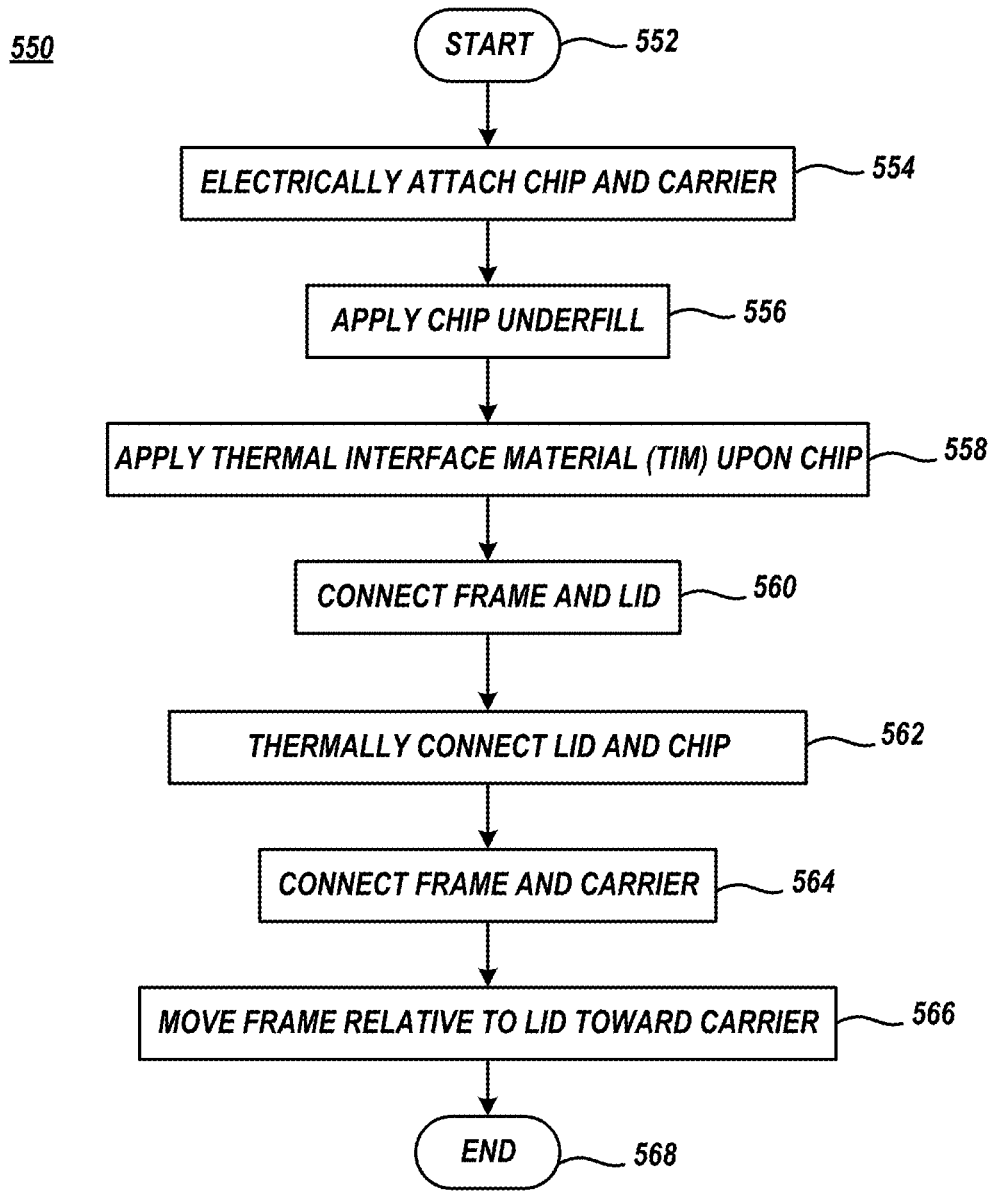

FIG. 9 depicts an exemplary method 550 for installing an electronic package 500. Once fabricated, the electronic package 500 may be installed into electronic device 100 by electrically connecting the electronic device to motherboard 106 via contacts 114 and by thermally connecting the electronic device to heat sink 114 via thermal interface material 118.

Method 550 begins at block 552 and continues with electrically attaching the chip 202 with the carrier 208 (block 554). In certain embodiments, chip 202 is attached using a flip-chip solder bump processes including a solder reflow. In other words, contacts 222 may be C4 contacts that electrically connect chip 202 and carrier 208.

Method 550 may continue by dispensing underfill 210 upon carrier 208 around the perimeter of chip 202 at an ambient temperature (block 556). The underfill 210 may be drawn under the chip 202 between the chip 202 and carrier 208 by capillary action. In some embodiments, underfill 210 may be subject to curing at an elevated temperature. The curing of underfill 210 may or may not coincide with the curing of seal band materials and/or thermal interface material. In some implementations the chip 202 may be electrically attached to carrier 208 and underfill 210 applied between chip 202 and carrier 208 prior to attaching frame 510 to carrier 208. Method 550 may continue with dispensing thermal interface material 212 upon the top surface of chip 202 (block 558).

Method 550 may continue with connecting frame 510 and lid 216 with bonding material 520 (block 560). The connected frame 510 and lid 216 generally form lid-frame assembly 530. Method 550 may continue with attaching lid-frame assembly 530 to carrier 208 and chip 202. For example, seal band 512 is formed upon carrier 208 about the perimeter of the chip 202. The lid-frame assembly 530 is connected to the carrier 208 via contact with seal band 512 and the lid-frame assembly 530 is thermally connected to the chip via thermal interface material 212. Initially, the lid 216 is arranged with respect to the frame 510 such that a gap 505 exists between the lid 216 and the frame 510. Subsequently, the bond material 520 fills the gap 505 to connect the lid 216 and frame.

Method 550 may continue by moving the frame 510 relative to the lid 216 toward carrier 208 (block 566). For example, the lid-frame assembly 530 may be heated or mechanically loaded to move the frame 510 away from the lid 216 towards the chip carrier 208. Heating of the lid-frame assembly 530 may be necessary in order for the bond material 520 to become compliant to allow the frame 510 to move relative to lid 216. For example, if bond material 520 is solder, a solder reflow allows the bond material 520 to become compliant such that frame 520 may move relative to lid 216. By moving the frame 510 toward carrier 208, the thickness of seal band 512 material is reduced thereby reducing potential warpage of electronic package 500. Method 550 ends at block 568.

In various embodiments, a method for installing an electronic package (e.g., electronic package 200, 300, 400, 500, etc.) into an electronic device 100 includes electrically attaching the electronic package to a system or mother board, applying a thermal interface material to the electronic package, and thermally connecting a heat sink to the electronic package. The thermal interface material may be injected, painted, spread, or otherwise applied to a top surface of the lid included within the electronic package. The heat sink may be attached to the lid utilizing thermal interface material, thermal tape, epoxy, clip(s), stand offs, and the like. Generally, a force may be applied to secure heat sink to electronic package.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 208, regardless of the actual spatial orientation of the carrier 208. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A electronic package comprising:
   a carrier comprising a top surface and a bottom surface;
   a semiconductor chip comprising a bottom surface electrically connected to the top surface of the carrier, a top surface, a front sidewall, a back sidewall, a left sidewall and a right sidewall;
   a lid thermally connected to a top surface of the semiconductor chip;
   two metal shim members arranged concentrically together around the semiconductor chip, wherein a first metal shim member comprises a front portion that is parallel with the front sidewall of the semiconductor chip and a right portion that is parallel with the right sidewall of the semiconductor chip and integral with the front portion, wherein a second metal shim member comprises a rear portion that is parallel to the back sidewall of the semiconductor chip and a left portion that is parallel to the left sidewall of the semiconductor chip and integral with the front portion, and wherein an end sidewall surface of the front portion that is parallel with the left sidewall of the semiconductor chip is coplanar with a perimeter sidewall surface of the left portion and an end sidewall surface of the rear portion that is parallel with the right sidewall of the semiconductor chip is coplanar with a perimeter sidewall surface of the right portion; and
   a seal band connected to the carrier and the lid perimeter and that surrounds the two metal shim members, the seal band comprising a first bead of thermally compliant seal-band material connected to the top surface of the carrier, connected to respective lower sidewall surface portions of the two metal shim members, and connected to respective bottom surfaces of the two metal shim members and a second bead of thermally compliant seal-band material connected to the lid perimeter, connected to respective upper sidewall surface portions of the two metal shim members, and connected to respective top surfaces of the two metal shim members, wherein the seal band separates an end sidewall surface of the right portion of the first metal shim member that is parallel with the back sidewall of the semiconductor chip from an inner sidewall surface of the rear portion of the second metal shim member, and wherein the seal band separates an end sidewall surface of the left portion of the second metal shim member that is parallel with the front sidewall of the semiconductor chip from an inner sidewall surface of the front portion of the first metal shim member.

2. The electronic package of claim 1, wherein the seal-band fills a gap between the carrier and an underside of the lid.

3. The electronic package of claim 1, wherein the seal-band material is an elastomeric material.

4. A electronic package comprising:
   a carrier comprising a top surface and a bottom surface;
   a semiconductor chip comprising a bottom surface electrically connected to the top surface of the carrier, a top surface, a front sidewall, a back sidewall, a left sidewall and a right sidewall;
   a lid thermally connected to a top surface of the semiconductor chip,
   two metal shim members directly upon the top surface of the carrier arranged concentrically together around the semiconductor chip, wherein a first metal shim member comprises a front portion that is parallel with the front sidewall of the semiconductor chip and a right portion that is parallel with the right sidewall of the semiconductor chip and integral with the front portion, wherein a second metal shim member comprises a rear portion that is parallel to the back sidewall of the semiconductor chip and a left portion that is parallel to the left sidewall of the semiconductor chip and integral with the rear portion, and wherein an end sidewall surface of the front portion that is parallel with the left sidewall of the semiconductor chip is coplanar with a perimeter sidewall surface of the left portion and an end sidewall surface of the rear portion that is parallel with the right sidewall of the semiconductor chip is coplanar with a perimeter sidewall surface of the right portion; and
   a seal band connected to the carrier and the lid perimeter and that surrounds three sides of each of the two metal shim members, the seal band comprising a first bead of thermally compliant seal-band material connected to the top surface of the carrier, connected to respective sidewall surfaces of the two metal shim members, connected to respective top surfaces of the two metal shim members and connected to the lid perimeter, wherein the seal band separates an end sidewall surface of the right portion of the first metal shim member that is parallel with the back sidewall of the semiconductor chip from an inner sidewall surface of the rear portion of the second metal shim member, and wherein the seal band separates an end sidewall surface of the left portion of the second metal shim member that is parallel with the front sidewall of the semiconductor chip from an inner sidewall surface of the front portion of the first metal shim member.

5. The electronic package of claim 4, wherein the seal-band fills a gap between the carrier and an underside of the lid.

6. The electronic package of claim 4, wherein the seal-band material is an elastomeric material.

* * * * *